United States Patent
Cody et al.

(10) Patent No.: US 9,127,345 B2
(45) Date of Patent: Sep. 8, 2015

(54) METHODS FOR DEPOSITING AN EPITAXIAL SILICON GERMANIUM LAYER HAVING A GERMANIUM TO SILICON RATIO GREATER THAN 1:1 USING SILYLGERMANE AND A DILUENT

(75) Inventors: Nyles W. Cody, Tempe, AZ (US); Shawn G. Thomas, Gilbert, AZ (US)

(73) Assignee: ASM America, Inc., Phoenix, AZ (US)

( * ) Notice: Subject to any disclaimer, the term of this patent is extended or adjusted under 35 U.S.C. 154(b) by 684 days.

(21) Appl. No.: 13/413,495

(22) Filed: Mar. 6, 2012

(65) Prior Publication Data
US 2013/0233240 A1  Sep. 12, 2013

(51) Int. Cl.
| | |
|---|---|
| C30B 25/16 | (2006.01) |
| C23C 16/02 | (2006.01) |
| H01L 21/02 | (2006.01) |

(Continued)

(52) U.S. Cl.
CPC ............. *C23C 16/0272* (2013.01); *C23C 16/42* (2013.01); *C30B 25/165* (2013.01); *C30B 29/52* (2013.01); *H01L 21/0245* (2013.01); *H01L 21/0262* (2013.01); *H01L 21/02381* (2013.01); *H01L 21/02532* (2013.01)

(58) Field of Classification Search
CPC ........ C30B 25/00; C30B 25/02; C30B 25/16; C23C 16/00; C23C 16/22; C23C 16/44
USPC ................... 117/84, 88–89, 93, 102, 105, 937
See application file for complete search history.

(56) References Cited

U.S. PATENT DOCUMENTS

| | | | |
|---|---|---|---|
| 4,363,828 A | 12/1982 | Brodsky et al. | |
| 5,221,413 A | 6/1993 | Brasen et al. | |

(Continued)

FOREIGN PATENT DOCUMENTS

| | | |
|---|---|---|
| EP | 0 858 101 | 8/1998 |
| EP | 1 681 711 | 7/2006 |

(Continued)

OTHER PUBLICATIONS

Bauer et al., "Crystalline to Amorphous Phase Transition in Very Low Temperature Molecular Beam Epitaxy", Materials Science and Engineering B89:263-268 (2002).

(Continued)

*Primary Examiner* — Kenneth A Bratland, Jr.
(74) *Attorney, Agent, or Firm* — Knobbe, Martens, Olson & Bear, LLP

(57) ABSTRACT

The present application relates to methods for depositing a smooth, germanium rich epitaxial film by introducing silylgermane as a source gas into a reactor at low temperatures. The epitaxial film can be strained and serve as an active layer, or relaxed and serve as a buffer layer. In addition to the silylgermane gas, a diluent is provided to modulate the percentage of germanium in a deposited germanium-containing film by varying the ratio of the silylgermane gas and the diluent. The ratios can be controlled by way of dilution levels in silylgermane storage containers and/or separate flow, and are selected to result in germanium concentration greater than 55 atomic % in deposited epitaxial silicon germanium films. The diluent can include a reducing gas such as hydrogen gas or an inert gas such as nitrogen gas. Reaction chambers are configured to introduce silylgermane and the diluent to deposit the silicon germanium epitaxial films.

19 Claims, 6 Drawing Sheets

(51) Int. Cl.
*C30B 29/52* (2006.01)
*C23C 16/42* (2006.01)

(56) References Cited

U.S. PATENT DOCUMENTS

| | | |
|---|---|---|
| 5,221,556 A | 6/1993 | Hawkins et al. |
| 5,256,550 A | 10/1993 | Laderman et al. |
| 5,259,918 A | 11/1993 | Akbar et al. |
| 5,308,788 A | 5/1994 | Fitch et al. |
| 5,442,205 A | 8/1995 | Brasen et al. |
| 5,445,897 A | 8/1995 | Satoh et al. |
| 5,461,250 A | 10/1995 | Burghartz et al. |
| 5,633,516 A | 5/1997 | Mishima et al. |
| 5,847,409 A | 12/1998 | Nakayama |
| 5,879,970 A | 3/1999 | Shiota et al. |
| 5,891,769 A | 4/1999 | Liaw et al. |
| 6,030,894 A | 2/2000 | Hada et al. |
| 6,093,252 A | 7/2000 | Wengert et al. |
| 6,107,653 A | 8/2000 | Fitzgerald |
| 6,154,475 A | 11/2000 | Soref et al. |
| 6,319,782 B1 | 11/2001 | Nakabayashi |
| 6,346,732 B1 | 2/2002 | Mizushima et al. |
| 6,350,993 B1 | 2/2002 | Chu et al. |
| 6,373,112 B1 | 4/2002 | Murthy et al. |
| 6,395,621 B1 | 5/2002 | Mizushima et al. |
| 6,411,548 B1 | 6/2002 | Sakui et al. |
| 6,425,951 B1 | 7/2002 | Chu et al. |
| 6,429,098 B1 | 8/2002 | Bensahel et al. |
| 6,455,871 B1 | 9/2002 | Shim et al. |
| 6,461,945 B1 | 10/2002 | Yu |
| 6,464,780 B1 | 10/2002 | Mantl et al. |
| 6,482,705 B1 | 11/2002 | Yu |
| 6,525,338 B2 | 2/2003 | Mizushima et al. |
| 6,537,370 B1 | 3/2003 | Hernandez et al. |
| 6,555,839 B2 | 4/2003 | Fitzgerald |
| 6,562,703 B1 | 5/2003 | Maa et al. |
| 6,562,736 B2 | 5/2003 | Yanagawa et al. |
| 6,573,126 B2 | 6/2003 | Cheng et al. |
| 6,592,942 B1 | 7/2003 | Van Wijck |
| 6,633,066 B1 | 10/2003 | Bae et al. |
| 6,635,110 B1 | 10/2003 | Luan et al. |
| 6,645,836 B2 | 11/2003 | Kanzawa et al. |
| 6,649,980 B2 | 11/2003 | Noguchi |
| 6,713,326 B2 | 3/2004 | Cheng et al. |
| 6,723,622 B2 | 4/2004 | Murthy et al. |
| 6,749,687 B1 | 6/2004 | Ferro et al. |
| 6,770,134 B2 | 8/2004 | Maydan et al. |
| 6,812,495 B2 | 11/2004 | Wada et al. |
| 6,821,825 B2 | 11/2004 | Todd |
| 6,830,964 B1 | 12/2004 | Mears et al. |
| 6,833,294 B1 | 12/2004 | Mears et al. |
| 6,844,213 B2 | 1/2005 | Sparks |
| 6,855,649 B2 | 2/2005 | Christiansen et al. |
| 6,858,502 B2 | 2/2005 | Chu et al. |
| 6,864,520 B2 | 3/2005 | Fischetti et al. |
| 6,875,279 B2 | 4/2005 | Chu et al. |
| 6,887,773 B2 | 5/2005 | Gunn, III |
| 6,900,115 B2 | 5/2005 | Todd |
| 6,905,972 B2 | 6/2005 | Oda |
| 6,953,736 B2 | 10/2005 | Ghyselen et al. |
| 6,958,253 B2 | 10/2005 | Todd |
| 6,995,076 B2 | 2/2006 | Wang et al. |
| 7,022,593 B2 | 4/2006 | Arena et al. |
| 7,026,219 B2 | 4/2006 | Pomarede et al. |
| 7,037,856 B1 | 5/2006 | Maa et al. |
| 7,049,627 B2 | 5/2006 | Vineis et al. |
| 7,115,521 B2 | 10/2006 | Brabant et al. |
| 7,132,338 B2 | 11/2006 | Samoilov et al. |
| 7,232,487 B2 | 6/2007 | Silver et al. |
| 7,238,595 B2 | 7/2007 | Brabant et al. |
| 7,329,593 B2 | 2/2008 | Bauer et al. |
| 7,357,838 B2 | 4/2008 | Lin et al. |
| 7,387,953 B2 | 6/2008 | Figuet |
| 7,390,725 B2 | 6/2008 | Maa et al. |
| 7,402,504 B2 | 7/2008 | Brabant et al. |
| 7,452,757 B2 | 11/2008 | Werkhoven et al. |
| 7,479,443 B2 | 1/2009 | Bauer |
| 7,608,526 B2 | 10/2009 | Cody et al. |
| 7,682,947 B2 | 3/2010 | Brabant et al. |
| 7,772,127 B2 | 8/2010 | Figuet et al. |
| 7,785,995 B2 | 8/2010 | Cody et al. |
| 7,825,401 B2 | 11/2010 | Cody et al. |
| 7,901,968 B2 | 3/2011 | Weeks et al. |
| 2002/0034864 A1 | 3/2002 | Mizushima et al. |
| 2002/0173104 A1 | 11/2002 | Chang |
| 2003/0036268 A1* | 2/2003 | Brabant et al. ............... 438/689 |
| 2003/0082300 A1 | 5/2003 | Todd et al. |
| 2003/0124818 A1 | 7/2003 | Luo et al. |
| 2003/0143783 A1 | 7/2003 | Maa et al. |
| 2003/0153161 A1 | 8/2003 | Chu et al. |
| 2003/0157787 A1 | 8/2003 | Murthy et al. |
| 2003/0162348 A1 | 8/2003 | Yeo et al. |
| 2003/0207127 A1 | 11/2003 | Murthy et al. |
| 2003/0230233 A1 | 12/2003 | Fitzgerald et al. |
| 2003/0235931 A1 | 12/2003 | Wada et al. |
| 2004/0075105 A1 | 4/2004 | Leitz et al. |
| 2004/0087117 A1 | 5/2004 | Leitz et al. |
| 2004/0097022 A1 | 5/2004 | Werkhoven et al. |
| 2004/0157409 A1 | 8/2004 | Ghyselen et al. |
| 2004/0178406 A1 | 9/2004 | Chu |
| 2004/0192002 A1 | 9/2004 | Soman et al. |
| 2004/0219735 A1 | 11/2004 | Brabant et al. |
| 2005/0051795 A1 | 3/2005 | Arena et al. |
| 2005/0054175 A1 | 3/2005 | Bauer |
| 2005/0067377 A1 | 3/2005 | Lei et al. |
| 2005/0079692 A1 | 4/2005 | Samoilov et al. |
| 2005/0150447 A1 | 7/2005 | Ghyselen et al. |
| 2005/0170577 A1 | 8/2005 | Yao et al. |
| 2005/0191826 A1 | 9/2005 | Bauer et al. |
| 2005/0277260 A1 | 12/2005 | Cohen et al. |
| 2006/0057825 A1 | 3/2006 | Bude et al. |
| 2006/0145188 A1 | 7/2006 | Dantz et al. |
| 2006/0211230 A1 | 9/2006 | Figuet |
| 2006/0216417 A1 | 9/2006 | Todd et al. |
| 2007/0044706 A1 | 3/2007 | Kang et al. |
| 2007/0048956 A1 | 3/2007 | Dip et al. |
| 2007/0051975 A1 | 3/2007 | Figuet et al. |
| 2007/0117398 A1 | 5/2007 | Okada et al. |
| 2007/0134886 A1 | 6/2007 | Quevedo-Lopez et al. |
| 2007/0155138 A1* | 7/2007 | Tomasini et al. ............ 438/483 |
| 2007/0264801 A1 | 11/2007 | Cody et al. |
| 2008/0017952 A1 | 1/2008 | Cody et al. |
| 2010/0006024 A1 | 1/2010 | Brabant et al. |
| 2011/0045646 A1* | 2/2011 | Kouvetakis et al. ........ 438/285 |

FOREIGN PATENT DOCUMENTS

| | | |
|---|---|---|
| JP | 04-245419 | 9/1992 |
| JP | H07-037823 | 2/1995 |
| JP | 10-256169 | 9/1998 |
| JP | 2000-021783 | 1/2000 |
| JP | 2000-286413 | 10/2000 |
| JP | 2002-525255 | 8/2002 |
| JP | 2002-539613 | 11/2002 |
| JP | 2003-023146 | 1/2003 |
| JP | 2004-179452 | 6/2004 |
| JP | 2005-518093 | 5/2005 |
| JP | 2005-536876 | 12/2005 |
| JP | 2006-191112 | 7/2006 |
| WO | WO 00/15885 | 3/2000 |
| WO | WO 00/54338 | 9/2000 |
| WO | WO 01/41544 | 6/2001 |
| WO | WO 02/097864 | 12/2002 |
| WO | WO 03/069658 | 8/2003 |

OTHER PUBLICATIONS

Bauer et al., "High Ge Content Photodetectors on Thin SiGe Buffers", *Materials Science and Engineering* B89:77-83 (2002).

Bauer et al., "Relaxed SiGe Buffers with Thicknesses Below 0.1 µm", *Thin Solid Films* 369:152-156 (2000).

Bensahel et al., "Single-Wafer Processing of In-Situ Doped Polycrystalline Si and $Si_{1-x}Ge_x$", *Solid State Technology*, pp. S5-S10 (Mar. 1998).

(56) References Cited

OTHER PUBLICATIONS

Bolkhovityanov et al., "Artificial GeSi Substrates for Heteroepitaxy: Achievements and Problems," *Semiconductors* 37(5): 493-518 (2003).

Cannon, D. et al., "Tensile Strained Epitaxial Ge Films on Si(100) Substrates with Potential Application in L-band Telecommunications," *Applied Physics Letters*, vol. 84, No. 6, Feb. 9, 2004, pp. 906-908.

Christiansen et al., "Strain Relaxation Mechanisms in He+-Implanted and Annealed $Si_{1-x}Ge_x$ Layers on Si(001) Substrates", Material Research Society Symposium Proceedings 686:A1.6.1-A1.6.6 (2002).

Chui et al., "Ultrathin High-$k$ Gate Dielectric Technology for Germanium MOS Applications", *IEEE 60th Annual Device Research Conference (DRC) Digest*, paper VII.B2, pp. 191-192 (2002).

Colace. et al., "Efficient High-Speed Near-Infrared Ge Photodetectors lintegrated on Si Substrates," *Applied Physics Letters*, vol. 76, No. 10, Mar. 6, 2000, pp. 1231-1233.

Colace et al., "Ge/Si(001) Photodetector for Near Infrared Light", *Solid State Phenomena* 54:55-58 (1997).

Colace et al. "Ge-on-Si Approaches to the Detection of Near-Infrared Light," *IEEE Journal of Quantum Electronics*, vol. 35, No. 12, Dec. 1999, pp. 1843-1852.

Colace et al., "Metal-Ge—Si Diodes for Near-Infrared light Detection", *Journal of Vacuum Science and Technology B* 17:465 (1999).

Colace et al., "Metal-Semiconductor-Metal Near-Infrared light Detector Based on Epitaxial Ge/Si", *Applied Physics Letters* 72:3175-3177 (1998).

Currie et al., "Controlling Threading Dislocation Densities in Ge on Si Using Graded SiGe Layers and Chemical-Mechanical Polishing", *Applied Physics Letters* 72:1718-1720 (1998).

Delhougne et al., "Development of a New Type of SiGe Thin Strain Relaxed Buffer Based on the Incorporation of a Carbon-Containing Layer", *Applied Surface Science* 224:91-94 (2004).

Fama, S. et al., "High Performance Germanium-on-Silicon Detectors for Optical Communications," *Applied Physics Letters*, vol. 81, No. 4, Jul. 22, 2002, pp. 586-588.

File History printed May 23, 2012 for U.S. Appl. No. 10/800,390, filed Mar. 12, 2004, entitled "Epitaxial Semiconductor Deposition Methods and Structures".

File History printed May 23, 2012 for U.S. Appl. No. 10/993,024, filed Nov. 18, 2004, entitled "Epitaxial Semiconductor Deposition Methods and Structures".

File History printed May 23, 2012 for U.S. Appl. No. 11/506,320, filed Aug. 18, 2006, entitled "Epitaxial Semiconductor Deposition Methods and Structures".

File History printed May 23, 2012 for U.S. Appl. No. 11/755,528, filed May 30, 2007, entitled "Epitaxial Semiconductor Deposition Methods and Structures".

File History printed May 23, 2012 for U.S. Appl. No. 12/556,377, filed Sep. 9, 2009, entitled "Epitaxial Semiconductor Deposition Methods and Structures".

File History printed May 23, 2012 for U.S. Appl. No. 11/067,307, filed Feb. 25, 2005, entitled "Germanium Deposition".

File History printed May 23, 2012 for U.S. Appl. No. 11/867,318, filed Oct. 4, 2007, entitled "Germanium Deposition".

File History printed May 23, 2012 for U.S. Appl. No. 11/388,313, filed Mar. 23, 2006, entitled "Heteroepitaxial Deposition Over an Oxidized Surface".

File History printed May 23, 2012 for U.S. Appl. No. 11/431,336, filed May 9, 2006, entitled "Semiconductor Buffer Structures".

File History printed May 23, 2012 for U.S. Appl. No. 11/491,616, filed Jul. 24, 2006, entitled "Strained Layers Within Semiconductor Buffer Structures".

File History printed May 23, 2012 for U.S. Appl. No. 12/562,029, filed Sep. 17, 2009, entitled "Strained Layers Within Semiconductor Buffer Structures".

Fischetti et al., "Band Structure, Deformation Potentials, and Carrier Mobility in Strained Si, Ge, and SiGe Alloys", *Journal of Applied Physics* 80:2234-2252 (1996).

Fitzgerald et al., "Totally Relaxed $Ge_xSi_{1-x}$ Layers with Low Threading Dislocation Densities Grown on Si Substrates," *Appl. Phys. Lett.* 59(7): 811-813 (1991).

Giovane et al., "Correlation Between Leakage Current Density and Threading Dislocation Density in SiGe p-i-n Diodes Grown on Relaxed Graded Buffer Layers", *Applied Physics Letters* 78:541-543 (2001).

Hackbarth et al., "Alternatives to Thick MBE-Grown Relaxed SiGe Buffers", *Thin Solid Films* 369:148-151 (2000).

Hartmann et al., "Reduced Pressure—Chemical Vapor Deposition of Ge Thick Layers on Si(001) for 1.3-1.55-µm Photodetection", *Journal of Applied Physics* 95:5905-5913 (2004).

Haynes et al., "Composition Dependence of Solid-Phase Epitaxy in Silicon—Germanium Alloys: Experiment and Theory", *Physical Review B* 51:7762-7771 (1995).

Herzog et al., "Si/SiGe n-MODFETs on Thin SiGe Virtual Substrates Prepared by Means of He Implantation", *IEEE Electron Device Letters*, 23:485-487 (2002).

Huang et al., "Electron and Hole Mobility Enhancement in Strained SOI by Wafer Bonding", *IEEE Transactions on Electron Devices* 49:1566-1571 (2002).

Huang et al., "SiGe-on-Insulator Prepared by Wafer Bonding and Layer Transfer for High-Performance Field-Effect Transistors", Applied Physics Letters 78:1267-1269 (2001).

Hull, R., "Metastable Strained Layer Configurations in the SiGe—Si System," (1999) EMIS Datareviews, Series No. 24: Properties of SiGe and SiGe:C, edited by Erich Kasper et al., INSPEC (2000), London, UK.

International Preliminary Report on Patentability for PCT/US2007/008879 mailed Nov. 20, 2008.

International Preliminary Report on Patentability for International Application No. PCT/US2007/072252, dated Nov. 3, 2008.

International Search Report for International Application No. PCT/US04/07564 dated Apr. 6, 2005.

Lee et al., "Electron mobility characteristics of $n$-channel metal-oxide-semiconductor field-effect transistors fabricated on Ge-rich single- and dual-channel SiGe heterostructures", *Journal of Applied Physics* 95:1550-1555 (2004).

Letertre et al., "Germanium-on-insulator (GeOI) structure realized by the Smart Cut™ technology", *MRS Proceedings*, vol. 809 (2004).

Levinshtein, Michael E., Rumyantsev, Sergey L, and Shur, Michael S., "Properties of Advanced Semiconductor Materials GaN, AlN, InN, BN, SiC, SiGe", John Wiley & Sons, Inc., 149-187 (2001).

Liszkay et al., "Strain Relaxation Induced by He-Implantation at the $Si_{1-x}Ge_x$/Si(100) Interface Investigated by Positron Annihilation", Applied Surface Science 194:136-139 (2002).

Liu et al., "Experimental Study of a Surficant-Assisted SiGe Graded Layer and a Symmetrically Strained Si—Germanium Superlattic for Thermoelectric Applications", Thin Solid Films 369:121-125 (2000).

Liu et al., "Silicidation—induced band gap shrinkage in Ge epitaxial films on Si," Applied Physics Letters, vol. 84, No. 5, Feb. 2, 2004, pp. 660-662.

Luan et al., "High-quality Ge epilayers on Si with low threading-dislocation densities", *Applied Physics Letters* 75:2909-2911 (1999).

Luysberg et al., "Effect of Helium Ion Implantation and Annealing on the Relaxation Behavior of Pseudomorphic $Si_{1-x}Ge_x$ Buffer Layers on Si(100) Substrates", Journal of Applied Physics 92:4290-4295 (2002).

Lyutovich et al., "Interaction between point defects and dislocations in SiGe", *Solid State Phenomena* 69-70:179-184 (1999).

Lyutovich et al., "Relaxed SiGe buffer layer growth with point defect injection", *Materials Science and Engineering* B71:14-19 (2000).

Lyutovich et al., "Thin SiGe buffers with high Ge content for $n$-MOSFETs", *Materials Science and Engineering* B89:341-345 (2002).

Masini, G et al.; "High-Performance p-i-n Ge on Si Photodetectors for the Near Infrared: From Model to Demonstration," *IEEE Transactions of Electron Devices*, vol. 48, No. 6, Jun. 2001, pp. 1092-1096.

Medeiros-Ribeiro et al., "Equilibrium Size Distributions of Clusters During Strained Epitaxial Growth", Materials Science and Engineering B67:31-38 (1999).

(56) References Cited

OTHER PUBLICATIONS

Nakamura et al., "InGaN/GaN/AlGaN-Based Laser Diodes with Modulation-Doped Strained-Layer Superlattices", Jap. J. Appl. Phys., vol. 36, No. 12A, Part 2, p. L1568-L1571 (1997).
Nam et al., "Lateral epitaxy of low defect density GaN layers via organometallic vapor phase epitaxy", Phys. Lett, vol. 71, No. 18, p. 2638 (1997).
Ni et al., "X-ray reciprocal space mapping studies of strain relaxation in thin SiGe layers (≤100 nm) using a low temperature growth step", *Journal of Crystal Growth* 227-228:756-760 (2001).
Obata et al., "Structural Characterization of $Si_{0.7}Ge_{0.3}$ Layers Grown on Si(001) Substrates by Molecular Beam Epitaxy," *J. Appl. Phys.* 81(1): 199-204 (1997).
Osten et al., "Relaxed $Si_{1-x}Ge_x$—$Si_{1-x-y}Ge_xC_y$ Buffer Structures with Low Threading Dislocation Density", Applied Physics Letters 70:2813-2815 (1997).
"Physics of Thin Films", printed from http:--www.uccs.edu-~tchriste-courses-PHYS549-549lectures-film2.html (Feb. 22, 2000).
Presting et al., "Buffer Concepts of Ultrathin Simgen Superlattices" Thin Solid Films, Elsevier-Sequoia S.A. Lausanne, CH, vol. 222, No. ½, Dec. 20, 1992, pp. 215-220.
Reinking et al., "Ge p-MOSFETs compatible with Si CMOS-technology", *Proceedings of the 29th ESSDERC* 99:300-303 (1999).
Samavedam et al., "High-quality germanium photodiodes integrated on silicon substrates using optimized relaxed graded buffers", *Applied Physics Letters* 73:2125-2127 (1998).
Schöllhorn et al., "Coalescence of germanium islands on silicon", *Thin Solid Films* 336:109-111 (1998).
Shang et al., "Electrical characterization of germanium p-channel MOSFETs", *IEEE Electron Device Letters* 24:242-244 (2003).
Singapore Search Report dated Jun. 16, 2009, received in Singapore Application No. 200809179-5, filed Jun. 27, 2007.
Singapore Written Opinion dated Jun. 16, 2009, received in Singapore Application No. 200809179-5, filed Jun. 27, 2007.
Sugii et al., "SiGe-on-Insulator Substrate Fabricated by Melt Solidification for a Strained-Silicon Complementary Metal-Oxide-Semiconductor", J. Vac. Sci. Technol. B20(5):1891-1896 (2002).
Sugiyama et al., "Formation of Strained-Silicon Layer on Thin Relaxed-SiGe/$SiO_2$/Si Structure Using SIMOX Technology", Thin Solid Films 369:199-202 (2000).
Taiwanese Office Action dated Apr. 30, 2010 for Taiwanese Patent Application No. 093106618.
Teichert et al., "Interplay of Dislocation Network and Island Arrangement in SiGe Films Grown on Si(001)", Thin Solid Films 380:25-28 (2000).
Thomas et al., "Structural characterization of thick, high-quality epitaxial Ge on Si substrates grown by low-energy plasma-enhanced chemical vapor deposition", *Journal of Electronic Materials* 32:976-980 (2003).
Trinkaus et al., "Strain Relaxation Mechanism for Hydrogen-Implanted $Si_{1-x}Ge_x$/Si(100) Heterostructures", Applied Physics Letters 76:3552-3554 (2000).

Vescan et al., "Relaxation Mechanism of Low Temperature SiGe—Si(100) Buffer Layers", ICSI3, p. 141 (Mar. 2003).
Wolf, "Silicon Processing for the VLSI Era", vol. 1: Process Technology, pp. 198 & 519-520 (1986).
Yamamoto et al., "Dislocation Structures and Strain-Relaxation in SiGe Buffer Layers on Si (0 0 1) Substrates with an Ultra-Thin Ge Interlayer," *Appl. Surface Sci.* 224: 108-112 (2004).
International Search Report for PCT/US05/06150 mailed Jun. 19, 2008.
International Search Report and Written Opinion for PCT Application No. PCT/US2007/072252 dated Dec. 19, 2007.
Isella et al., "Low-energy plasma-enhanced chemical vapor deposition for strained Si and Ge heterostructures and devices" Solid State Electronics, Elsevier Science Publishers, Barking, GB, vol. 48, No. 8, Aug. 2004, pp. 1317-1323.
Ishikawa, Y. et al., "Strain-Induced Band Gap Shrinkage in Ge Grown on Si Substrate," *Applied Physics Letters*, vol. 82, No. 12, Mar. 31, 2003, pp. 2044-2046.
Jackson et al., "Gate-Self-Aligned p-Channel Germanium MISFET's", *IEEE Electron Device Letters* 12:605-607 (1991).
Kamins et al., "Deposition of Three-Dimensional Germanium Islands on Si(001) by Chemical Vapor Deposition at Atmospheric and Reduced Pressures", J. Appl. Phys. 81:211-219 (1997).
Kasper, "Prospects of SiGe Heterodevices", *Journal of Crystal Growth* 150:921-925 (1995).
Kasper et al., "New Virtual Substrate Concept for Vertical MOS Transistors", *Thin Solid Films* 336:319-322 (1998).
Kutsukake et al., "Fabrication of SiGe-On-Insulator through Thermal Diffusion on Germanium on Si-on-Insulator Substrate", Jpn. J. Appl. Phys. 42:L232-L234 (2003).
Langdo et al., "High quality Ge on Si by epitaxial necking", Applied Physics Letter, vol. 76, No. 25, pp. 3700-3702, Jun. 19, 2000.
Lee et al., "Electron mobility characteristics of n-channel metal-oxide-semiconductor field-effect transistors fabricated on Ge-rich single-and dual-channel SiGe heterostructures", *Journal of Applied Physics* 95:1550-1555 (2004).
Lee et al., "Growth of strained Si and strained Ge heterostructures on relaxed $Si_{1-x}G_{ex}$ by ultrahigh vacuum chemical vapor deposition," J. Vac. Sci. Technol. B 22(1) (Jan.-Feb. 2004).
Lee et al., "Strained Ge channel p-type metal-oxide-semiconductor field-effect transistors grown on $Si_{1-x}Ge_x$—Si virtual substrates", *Applied Physics Letters* 79:3344-3346 (2001).
Lee et al., "Strained Si-strained Ge dual-channel heterostructures on Relaxed $Si_{0.5}Ge_{0.5}$ for symmetric mobility p-type and n-type metal-oxide-semiconductor field-effect transistors", *Applied Physics Letters* 83:4202-4204 (2003).
Letertre et al., "Germanium-on-insulator (GeOI) structure realized by the Smart Cut™technology", *MRS Proceedings*, vol. 809 (2004).
Levinshtein, Michael E., Rumyantsev, Sergey L, and Shur, Michael S., "Properties of Advanced Semiconductor Materials GaN, AiN, InN, Bn, SiC, SiGe", John Wiley & Sons, Inc., 149-187 (2001).
Li et al., "Selective growth of Ge on Si(100) through vias of $SiO_2$ nanotemplate using solid source molecular beam epitaxy," Applied Physics Letters, vol. 83, No. 24, Dec. 15, 2003, pp. 5032-5034.

\* cited by examiner

PROVIDE A SEMICONDUCTOR SUBSTRATE INTO A CHAMBER.

HEAT SUBSTRATE TO BETWEEN ABOUT 350°C – 475°C

DEPOSIT A SILICON GERMANIUM EPITAXIAL LAYER OVER THE SUBSTRATE BY INTRODUCING SILYLGERMANE SOURCE GAS. ALLOW THE EPITAXIAL LAYER TO RELAX.

DEPOSIT A SECOND EPITAXIAL LAYER OVER THE RELAXED SILICON GERMANIUM EPITAXIAL LAYER.

Layer is specular at 5X    Nearly Featureless at 100X

METHODS FOR DEPOSITING AN EPITAXIAL SILICON GERMANIUM LAYER HAVING A GERMANIUM TO SILICON RATIO GREATER THAN 1:1 USING SILYLGERMANE AND A DILUENT

BACKGROUND OF THE INVENTION

1. Field of the Invention

This application relates to methods for depositing heteroepitaxial films in semiconductor manufacturing. More particularly, this application relates to methods for depositing silicon germanium heteroepitaxial films by using silylgermane as a source gas.

2. Description of the Related Art

Silicon germanium (SiGe) films are used in a wide variety of semiconductor applications, including microelectronic devices. One issue that often arises is how to increase the amount of "strain" in an active layer of a device, which leads to increased device performance. A deposited epitaxial layer is said to be "strained" when it is constrained to have a lattice structure in at least two dimensions that is the same as that of the underlying single crystal substrate, but different from its inherent lattice constant. Lattice strain occurs because the atoms in the deposited film depart from the positions that they would normally occupy in the lattice structure of the free-standing, bulk material when the film deposits in such a way that its lattice structure matches that of the underlying single crystal substrate. For example, greater amounts of germanium in an epitaxial layer deposited onto a single crystal silicon substrate or layer generally increase the amount of compressive strain. This strain occurs because germanium in its pure form has a 4% greater lattice constant compared to silicon. Therefore, the higher the germanium content, the greater the lattice mismatch with the underlying silicon.

Strain is in general a desirable attribute for active device layers, since it tends to increase the mobility of electrical carriers and thus increase device speed. In order to produce strained layers on conventional silicon structures, however, it is often helpful to create strain-free, intermediate heteroepitaxial layers for further strained layers that will serve as active layers in semiconductor devices. These intermediate films often comprise a relaxed silicon germanium "buffer" layer over a single crystal semiconductor substrate or wafer surface.

To be an effective buffer layer, the silicon germanium layer should be relaxed. When the thickness of the silicon germanium buffer layer increases above a certain thickness, called the "critical thickness," the buffer layer begins to relax to its inherent lattice constant, which requires the formation of misfit dislocations at the film/substrate interface. The critical thickness depends on a variety of factors, including growth rate, growth temperature, germanium concentration, and the number of defects within the layer underlying the silicon germanium layer. Once the silicon germanium layer reaches its critical thickness, the layer begins to relax toward its own lattice size and strain is reduced. A silicon germanium layer that has adopted its own natural lattice constant on a nanometer scale through the film may be considered fully relaxed.

Depositing silicon germanium films presents several challenges. Often, it is difficult to achieve a high germanium concentration, whether for maintaining strain or relaxing for use as a buffer, without excessive faults that interfere with electrical operation of the integrated circuit. In addition, it is often difficult to deposit silicon germanium films that are thin and smooth, particularly at low temperatures, to both conserve thermal budget and maintain flatness for integration with subsequent processing. Although numerous source gases are available to create silicon germanium layers, each has its limitations. For example, conventional source gases (e.g. silane) are unable to deposit smooth homogeneous films of low thickness at low temperatures. These source gases often result in films with high surface roughness due to nucleation islands.

More exotic source gases, such as $SiH_3GeH_3$, $(H_3Ge)_2SiH_2$, $(H_3Ge)_3SiH$ and $(H_3Ge)_4Si$ have been used to deposit silicon germanium layers. One of the perceived advantages for such gases, containing both germanium and silicon, is that the intrinsic ratio of Si:Ge within the compound is thought to strongly influence the ratio of Si:Ge in the deposited film, permitting wider process windows for a given desired ratio. However, these source gases are costly, lack the flexibility of conventional precursors, and often entail significant hardware adjustments and tuning that have not generally been found worthwhile compared to the perceived benefits of these precursors.

SUMMARY OF THE INVENTION

Briefly stated, the embodiments described herein provide methods and apparatuses for depositing a smooth, germanium-rich epitaxial film by introducing silylgermane as a source gas into a reactor at relatively low temperatures. Amounts of a diluent can be varied to modulate levels of germanium incorporation into the epitaxial silicon germanium film. Examples of diluents include reducing agents, such as hydrogen gas. In some embodiments, one or more inert gases such as nitrogen gas, can be used as a diluent to control silylgermane partial pressures, thereby modulating ratios of Ge: Si in the resultant film to be above 1:1.

Methods of film deposition are described and comprise providing a semiconductor substrate into a reaction chamber. The substrate is placed on a susceptor in the reaction chamber. A precursor comprising silylgermane ($SiGeH_6$) is introduced to the reaction chamber to deposit an epitaxial silicon germanium layer on the substrate comprising greater than 55 atomic % germanium by volume.

Additional methods of film deposition are provided comprising providing a substrate into a reaction chamber and placing the substrate on a susceptor in the reaction chamber. Silylgermane gas is introduced into the reaction chamber to deposit an epitaxial silicon germanium layer on the substrate. In addition to the silylgermane gas, a diluent is introduced into the reaction chamber to modulate the level of germanium incorporation in the deposited epitaxial silicon germanium layer to be greater than 55 atomic % germanium.

Reaction chambers for depositing silicon germanium films are also provided. In some embodiments, a reaction chamber includes a reaction gas inlet and a reaction gas outlet defining a gas flow path therebetween. The reaction chamber includes a support for supporting a substrate within the gas flow path in the reaction chamber. The reaction chamber further includes a gas line communicating silylgermane gas between a container storing silylgermane and the reaction chamber and a gas line communicating $H_2$ gas between a container storing $H_2$ gas and the reaction chamber. The reaction chamber includes a control system programmed to supply the silylgermane gas and $H_2$ gas into the reaction chamber.

In one embodiment, $H_2$ is stored in the same container as silylgermane. In one embodiment, $H_2$ is supplied from a separate container and controls are provided for modulating the ratio of silylgermane to hydrogen.

BRIEF DESCRIPTION OF THE DRAWINGS

These and other features, aspects and advantages of the various devices, systems and methods presented herein are described with reference to drawings of certain embodiments, which are intended to illustrate, but not to limit, such devices, systems, and methods. The drawings include nine figures. It is to be understood that the attached drawings are for the purpose of illustrating concepts of the embodiments discussed herein and may not be to scale.

DETAILED DESCRIPTION OF EMBODIMENTS

Methods and apparatuses are provided for depositing a smooth silicon germanium (SiGe) epitaxial layer having controllable germanium content over a substrate in a reaction chamber. In some embodiments, a source gas comprising silylgermane (SiGeH$_6$) is introduced into a reaction chamber to deposit a silicon germanium layer having a high percentage of germanium. The term "substrate," as used herein, can refer to a bare wafer or to a workpiece with existing layers.

According to methods described herein, a silicon germanium layer having a high percentage of germanium (e.g., greater than 55 atomic %) can be deposited. In some embodiments, the deposited silicon germanium layer can serve as a strained layer that produces a compressive lattice strain on an underlying layer. This lattice strain results due to the natural lattice constant of the silicon germanium layer being higher than the natural lattice constant of the underlying substrate. In other embodiments, rather than serving as a strained layer, the deposited silicon germanium layer serves as a relaxed buffer layer for subsequently deposited, overlying strained layers. As a buffer layer, the silicon germanium layer serves as a template for overlying strained layers that help to increase the carrier mobility in the underlying substrate. In some embodiments, an overlying strained layer above the deposited silicon germanium layer comprises a strained silicon or strained germanium layer, which is forced to align with the lattice constant of the relaxed silicon germanium buffer layer.

Various source gases and liquids can be used to deposit a silicon germanium layer having a high germanium concentration. In some embodiments, silylgermane is the source gas. While silylgermane gas is rarely used in conventional deposition processes due to the difficulty in manufacturing the gas and its relatively limited shelf-life, it has been found that using silylgermane provides a number of particular advantages. One advantage of using silylgermane is cost savings, as it is cheaper to produce than many other complex source gases. A second advantage of using silylgermane is the ability to deposit smooth, high-quality silicon germanium films at very low temperatures. This is particularly advantageous for achieving higher strain on a reduced thermal budget. Moreover, such smooth, low temperature film depositions can produce greater than 50% germanium epitaxial. Surprisingly, it has been found that the germanium context can be modulated above the 1:1 ratio of Ge:Si in the precursor, particularly by controlling partial pressures and/or reduction by introducing a diluent with the silylgermane gas. The term "diluent," as used herein, can refer to an inert gas, such as nitrogen or argon gas, or to a reducing gas, such as hydrogen gas. In some embodiments, the silylgermane is stored with the diluent; in other embodiments, the diluent is separately supplied.

Process Reactor

Figure 1A:
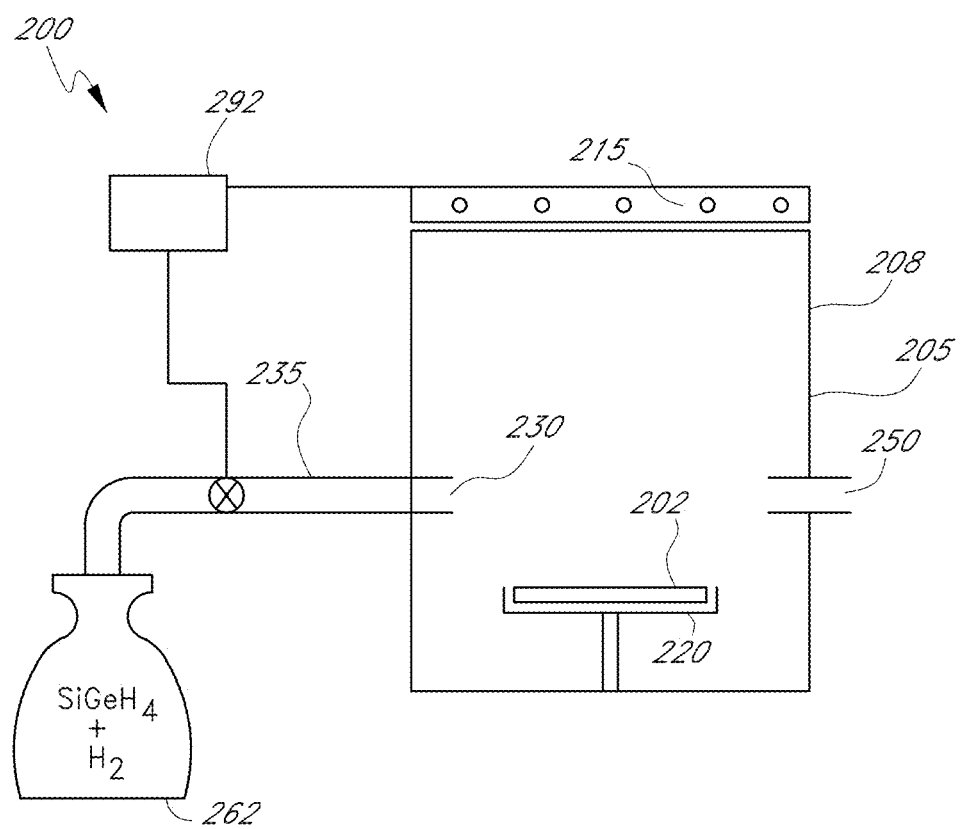
FIG. 1A illustrates a schematic view of a reaction chamber according to embodiments of the present application.
Figure 1B:
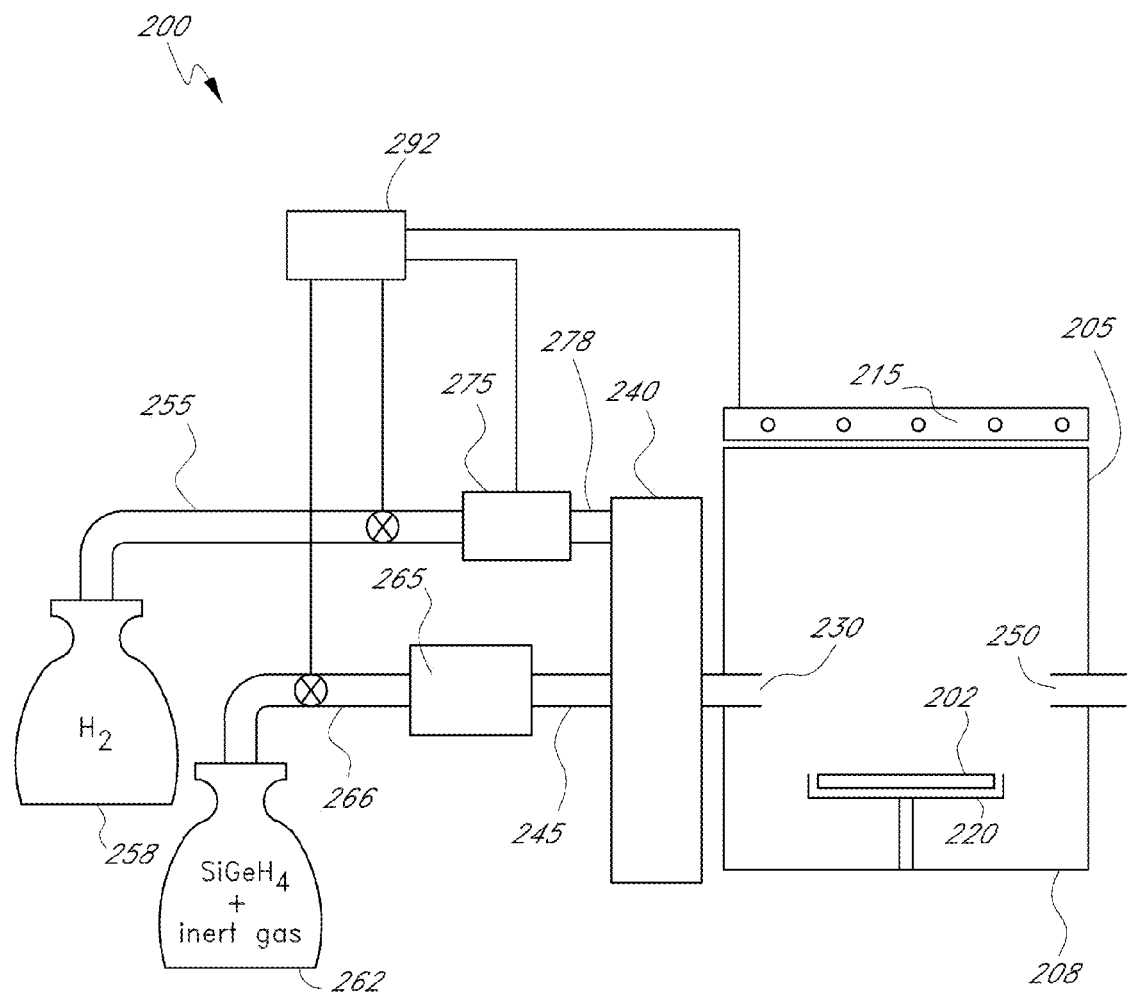
FIG. 1B illustrates a schematic view of another reaction chamber according to embodiments of the present application.

FIGS. 1A and 1B schematically illustrate chemical reactors 200 including a reaction chamber 205 and one or more containers for source gases, for which the methods disclosed herein have particular utility. FIG. 1A illustrates one embodiment of a CVD reaction chamber 205 having quartz process walls 208. The reaction chamber 205 includes a plurality of radiant heat sources 215 supported outside the chamber to provide heat energy to the chamber 205 without appreciable absorption by the quartz chamber walls 208. These heat sources can include an assembly of elongated tube-type radiant heat elements, each of which may be a high intensity tungsten filament lamp having a transparent quartz envelope containing a halogen gas, such as iodine. While the preferred embodiments are described in the context of a "cold wall" CVD reactor for processing semiconductor wafers, it will be understood that the processing methods described herein will have utility in conjunction with other heating systems, such as those employing inductive or resistive heating.

A substrate 202, preferably comprising a silicon wafer, is shown supported within the reaction chamber 205 upon a susceptor or wafer support structure 220. In some embodiments, by using the heat sources 215, the substrate 202 can be quickly heated in a hydrogen bake or similar oxide reduction step to rid the substrates of contaminants. The heat sources 215 can also be used to control the substrate 202 to the desired deposition temperature at which a silicon germanium layer can be deposited thereover. In some embodiments, the heat sources 215 are used to first heat the substrate to a temperature of above 600° C. or above 700° C. in a bake step to rid the substrate of contaminants, such as carbon and native oxide. The substrate can be subsequently cooled to a reduced temperature (e.g., between 300° C. and 475° C.) suitable for depositing a silicon germanium film. In other arrangements, chemical etchants can replace or augment the high temperature bake step.

The illustrated reaction chamber 205 includes an inlet port 230 which can include gas injectors for the injection and distribution of source gases and/or carrier gases. The inlet port 230 leads to a gas line 235. In addition to the inlet port, an outlet port 250 can be found on the opposite side of the chamber 205, forming a gas flow path therebetween. While not shown, a vacuum pump is preferably connected to the outlet 250. In some embodiments, the wafer support structure 220 is positioned between the inlet 230 and outlet 250 and in the gas flow path, as in the illustrated laminar, horizontal flow arrangement. In other arrangements, precursors can be provided with radial symmetry over the wafer (e.g., by a showerhead) and/or by backfill and soak. In some embodiments, the reaction chamber 205 can also be connected to a liquid bubbler (not shown) so that liquid sources can also be used to deposit films in the chamber 205.

The gas line 235 is connected to a container 262, which is used to house a source gas or liquid. As shown in FIG. 1A, the source gas comprises silylgermane, which is packed under pressure with hydrogen gas (H$_2$). In other embodiments, the silylgermane gas is stored with a selected mixture of inert gas (e.g., N$_2$, Ar, Kr, Ne, He) and hydrogen. In still other embodiments, the silylgermane is stored with an inert gas, and hydrogen is provided separately during operation.

Without being limited by theory, it is believed that the addition of at least some diluent (e.g., inert gas or reducing gas) mixed with the silylgermane helps to deposit a silicon germanium film with high germanium content, particularly higher than 50 atomic % Ge. For embodiments in which silylgermane is stored with hydrogen as a reducing gas, or at least part of the reducing gas in the container, some amount of precursor decomposition within the container 262 can aid in increasing germanium content in deposited epitaxial films above the 1:1 ratio intrinsic in the precursor. In particular, germanium concentration in epitaxial silicon germanium films was found to be higher than 55 atomic % when silylgermane was stored with hydrogen. The container 262 had silylgermane diluted to 0.5% in hydrogen, a container volume 16 L, and was provided with an initial pressure of about 1600 psi. For embodiments in which silylgermane is stored with hydrogen (with or without additional inert gas diluent), the volume ratio of silylgermane in the container 262 to hydrogen in the container is typically within the range of 1:1000 to 1:20, more particularly of about 1:250 to 1:100.

In other embodiments, the silylgermane can be stored with an inert or hydrogen gas as the diluent. In some embodiments in which silylgermane is stored with nitrogen (with or without additional inert gas diluent), the volume ratio of silylgermane in the container 262 to nitrogen in the container can be within the same range as that of silylgermane to hydrogen discussed above. The germanium content can be modulated by controlling the partial pressure of silylgermane during deposition, which can be influenced by the diluent as stored and any separately supplied diluent or carrier gas.

As shown in FIGS. 1A and 1B, the reactor 260 includes a control system 292 programmed to supply silylgermane gas and $H_2$ gas into the reaction chamber 205. In some embodiments, the control system 292 is connected by electrical lines to the heat sources 215 and to control devices (e.g., valves, mass flow controllers, etc.) along the pipes (e.g., 235, 255 and 266) that are used to deliver source gases into the reaction chamber 205. The control system 292 provides various memory, programming and processing functions. In some embodiments, these functions assist in modulating the amount of silylgermane gas relative to the amount of $H_2$ gas provided into the chamber 205.

FIG. 1B illustrates another embodiment of a reactor 200. The reaction chamber 205 includes an inlet 230 and outlet 250. The inlet 230 is connected via a gas line 270 to an inlet manifold 240. The inlet manifold 240 is connected via a gas line 245 to a mass flow controller (MFC) 265, which is connected by another gas line 266 to the first container 262. The inlet manifold 240 is also connected via a gas line 255 to a second container 258. While illustrated in parallel, the second container 258 can alternatively be connected in series upstream of the first container 262 and serve as a carrier gas drawing and entraining precursor from the first container 262.

As shown in FIG. 1B, the first container 262 houses silylgermane gas and an inert gas. In the illustrated embodiment, hydrogen gas is stored separately from the silylgermane gas in a second container 258. The second container 258 is connected via the gas line 255 to a second mass flow controller 275, which is connected via a gas line 278 to inlet manifold 240. The hydrogen gas serves as a carrier or diluent gas, and is supplied into inlet manifold 240 and ultimately into the reaction chamber 205. Hydrogen also serves as a reducing gas to aid decomposition of the silylgermane during deposition. The parallel lines with separate mass flow controllers 265, 275 allow the volume ratio of silylgermane to hydrogen supplied to the reaction chamber 205 to be modulated, such that the ratio is typically within the range of 1:1000 to 1:20, more particularly between 1:250 and 1:100. The skilled artisan will appreciate that the ratio of silylgermane to hydrogen can alternatively be controlled by other metering devices. In some embodiments, the hydrogen gas can also react with other gases (e.g., chlorine-based gases) to activate etching reactions in selective deposition. The reactor in FIG. 1B provides the hydrogen gas in a separate container from the silylgermane gas and allows for wafer-to-wafer control over the film composition. Instead of or in addition to any hydrogen within the precursor source container 262, a separate supply of hydrogen gas from its own source makes it easier to control the ratio of silylgermane relative to hydrogen, and therefore, allows for greater control over the film deposition process and a greater range of germanium percentages in silicon germanium films. While second container 258 illustrates hydrogen as a supplemental inert gas, other gases can also be provided instead of or in addition to hydrogen, including triethyl boron (TEB), alcohols, carboxylic acids and aldehydes.

In the embodiment shown in FIG. 1B, the first container 262 contains silylgermane gas and a non-reactive, inert gas. The inert gas can include argon (Ar), helium (He), neon (Ne), nitrogen ($N_2$), or other suitable gases. In some embodiments, the percentage of the silylgermane gas in the first container 262 is between about 0.1% and 10%.

As shown in FIG. 1B, the first container 262 is connected via the gas line 266 to the first mass flow controller (MFC) 265, which is coordinated at a gas panel. Process gases are communicated to the inlet 230 in accordance with directions programmed into the control system 292 for the first and second mass flow controllers 265, 275 or other metering device(s) before being distributed into the reaction chamber 205. The metering device can help control the film deposition rate by controlling the introduction of silylgermane and other source gases into the chamber. For example, in some embodiments, the first mass flow controller 265 can control the flow rate of silylgermane into the chamber, such that it flows between a certain flow rate (e.g., between approximately 70 sccm and 175 sccm). Associated with the flow rate is the deposition rate of silicon germanium, which in some embodiments, is between approximately 8 and 12 nm/hour.

A separate carrier gas (not shown) can also be provided to deliver the silylgermane from the first container 262 to the reaction chamber 205. In some embodiments, the carrier gas comprises hydrogen and serves as the reducing agent and can be made highly pure, due to its low boiling point, and is compatible with the deposition of silicon germanium. In this case, the second container 258 supplying hydrogen can be positioned upstream of the first container 262, as mentioned above. Other suitable carrier gases can include inert gases such as argon (Ar), helium (He), neon (Ne), and nitrogen ($N_2$).

In some embodiments, supplemental reactant sources can be supplied, via gas lines, into the reaction chamber 205 to further aid in modulating silicon or germanium concentration in the SiGe layer, electrically doping or attaining selectivity. Such supplemental sources can include etchants (e.g., HCl, $Cl_2$), dopant sources (e.g., arsine, phosphine, borane), and silicon or germanium sources that will decompose at the substrate temperature of operation (e.g., germane, trisilane). One skilled in the art will appreciate that the addition of supplemental sources besides silylgermane gas is optional, and that using silylgermane gas without such supplemental sources allows for a film having a high germanium content. Moreover, while supplemental silicon and germanium sources may aid modulation of germanium content for the embodiment of FIG. 1A, they are unnecessary for FIG. 1B, which can modulate germanium content without supplemental silicon or germanium sources.

The reaction chamber 205 can also communicate with containers for etchants that can be used to clean unwanted film deposits on reactor walls, such as fluorine-based etchants, and optional plasma sources for more effective cleaning at low temperatures.

Processes

Figure 2:
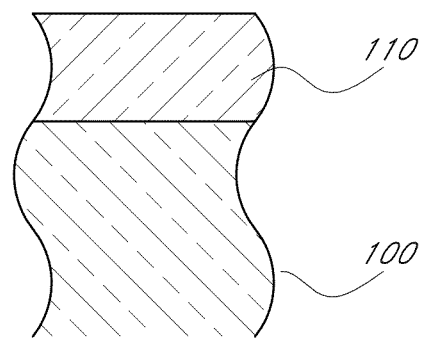
FIG. 2 illustrates a cross-sectional view of a substrate and a germanium-containing epitaxial layer deposited thereover according to embodiments of the present application.

Methods for depositing silicon germanium films having high germanium concentration are described below. FIG. 2 illustrates a strained silicon germanium layer 110 deposited over a silicon substrate 100. In contrast, FIGS. 3A-3D and the accompanying flow chart therein illustrate a silicon germanium layer 310 deposited over a substrate 300 that serves as an intermediate buffer layer for an overlying strained or relaxed layer 320.

In accordance with FIG. 2, the substrate 100 is first provided into a reaction chamber. The substrate 100 can include a silicon wafer, a silicon-on-insulator wafer, or a substrate with an existing layer deposited thereover.

In some embodiments, before depositing an epitaxial layer over the substrate, the surface of the substrate is cleaned to remove contaminants. The substrate can be cleaned by heating the substrate 100 in a bake step to a temperature greater than about 600° C. or greater than about 700° C. and/or use etchants in situ or ex situ. Following the cleaning of the substrate 100, the substrate 100 can be brought to an appropriate deposition temperature between about 250° C. and 525° C., and preferably between about 300° C. and 475° C., in preparation for a chemical vapor deposition process. This low deposition temperature range of between about 300° C. and 475° C. is ideal for silylgermane gas, but is generally too low for standard source gases such as silane and disilane to operate due to their greater thermal stability. In some embodiments, the temperature of the substrate is maintained above 350° C. during the entire deposition process. The pressure in the reaction chamber is preferably also controlled. In some embodiments, the pressure is kept at about atmospheric pressure, while in some embodiments, the pressure is kept between about 50 Torr and 100 Torr in the reaction chamber during deposition.

Once the substrate is at a temperature between about 300° C. and 475° C., a source gas comprising silylgermane can be introduced into the chamber to deposit a germanium-containing film (e.g., a germanium film or a silicon-germanium film) on the substrate. In addition to the silylgermane source gas, a diluent to aid decomposition of silylgermane at the deposition temperature can be introduced into the chamber. In the illustrated embodiments, the diluent comprises a reducing gas such as hydrogen gas. The silylgermane source gas and the hydrogen gas can be stored together in the same bottle (as in FIG. 1A), while in other embodiments, the silylgermane source gas can be stored separately from the hydrogen gas (as in FIG. 1B). In some embodiments, silylgermane source gas can be stored with hydrogen gas as a diluent in a first bottle, with or without additional inert diluent, while a separate source of hydrogen gas is stored in a second bottle for modulating the ratio of silylgermane to hydrogen in operation. It has been found that by introducing silylgermane with an amount of hydrogen, it is possible to modulate the percentage of germanium in a deposited germanium-containing film by introducing hydrogen gas (as stored with the silylgermane gas, from a separate container, or both) and controlling the ratio of silylgermane to hydrogen. By introducing hydrogen gas in addition to the silylgermane gas, it has been found that germanium-containing films can be deposited having a germanium percentage as high as 90%. In some embodiments, the silylgermane diluted to 0.5 vol. % can be introduced at a flow rate between about 70 sccm and 175 sccm. In some embodiments, the flow of the silylgermane remains relatively constant, while in other embodiments, the flow of the silylgermane can vary during the deposition process. In some embodiments, in addition to the silylgermane source gas, a hydrogen gas flow can also be provided at a flow rate between about 10 sccm and 5 slm.

By using silylgermane and a reducing gas, a smooth silicon germanium film 110 having a high germanium percentage can be deposited on the silicon substrate 100. In some embodiments, the silicon germanium film will have a surface roughness of 5 nm rms, more preferably of 3 nm rms or less. In some embodiments, the surface roughness is between 1 and 3 nm rms. A silicon germanium film can be deposited having a high germanium percentage between about 55% and 90%, more preferably between 65% and 85%, thereby resulting in a high-degree of strain. In some embodiments, when the silylgermane source gas and hydrogen gas are stored in the same bottle and flowed together into the reaction chamber, a germanium-containing film can be deposited having a germanium content between about 60% and 85%. In some embodiments, when the silylgermane source gas and hydrogen gas are stored in separate containers and flown separately into the reaction chamber, a germanium-containing film can be deposited having a germanium percentage between about 55% and 90%. As pure germanium has a lattice constant that is about 4% greater than that of pure silicon, the epitaxial layer 310 will at least initially be in compressive strain with respect to the underlying silicon layer 300 unless deposited to greater than the critical thickness.

At the temperature ranges described above (e.g., between about 300° C. and 475° C.), the rate of deposition of the silicon germanium film 110 can be high. In some embodiments, the rate of deposition is about 10 nm/hr. This rate can be controlled by controlling the flow rate of the silylgermane source gas (e.g., by using the mass flow controller), as well as by controlling other parameters, such as the temperature of the wafer. In some embodiments, the deposited silicon germanium film 110 is a thin film that is less than 10 nm in thickness such that it generally remains strained at the preferred deposition temperatures. In other embodiments, the deposited silicon germanium film 110 is a thicker film that is 10 nm or greater. While thinner films are generally strained and thicker films generally more relaxed, the amount of strain in the film will depend on a number of factors, including the crystal structure of the starting substrate and deposition temperature. In addition, the critical thickness of a film can also vary based on underlying substrate quality, germanium content and chamber conditions. In some embodiments, the silicon germanium film 110 will have a critical thickness at the deposition conditions of approximately 10 nm, such that the film 110 is strained at a thickness beneath about 10 nm, while it is partially or fully relaxed at thicknesses greater than or equal to about 10 nm. As noted above, the critical thickness of the film will be dependent on temperature, such that at temperatures of approximately 300° C., a film of about 10 nm and a particular concentration of Ge will be strained, while at temperatures of approximately 450° C., a film of the same thickness and germanium concentration will be relaxed. One skilled in the art will appreciate that relaxation of a strained layer does not occur automatically, but rather on a continuum, based on a number of factors, including film thickness composition and temperature.

In contrast to the strained silicon germanium layer 110 found in FIG. 2, FIGS. 3A-3D (with accompanying flow chart) illustrate a silicon germanium layer 310 that serves as an intermediate buffer layer for a subsequently formed overlying layer 320. The process illustrated includes providing a semiconductor substrate 300 into a reaction chamber, heating the substrate 300 to a temperature between about 350° C. and 475° C., depositing a silicon germanium epitaxial layer 310 over the substrate by introducing a silylgermane source gas along with stored or co-flowed reducing gas, allowing the silicon germanium epitaxial layer 310 to relax, and depositing a second epitaxial layer 320 over the relaxed silicon germanium epitaxial layer 310.

Figure 3A:
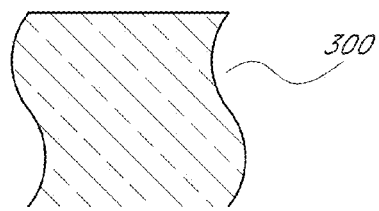
FIGS. 3A-3D illustrate cross-sectional views of a substrate at various stages of a deposition process with corresponding flow chart according to embodiments of the present application.
Figure 3B:
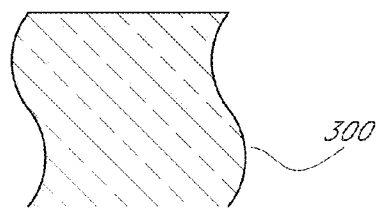

As shown in FIG. 3A, a semiconductor substrate 300 is provided into the reaction chamber. After providing the substrate 300 to the chamber, the substrate 300 is heated to between about 350° C. and 475° C. The substrate 300 can be maintained at a constant temperature between about 350° C. and 475° C. during the entire deposition process.

Figure 3C:
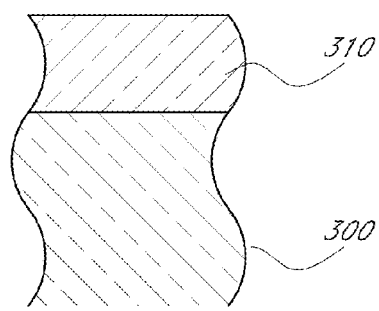

As shown in FIG. 3C, once the substrate 300 is heated to between about 350° C. and 475° C., a silicon germanium epitaxial layer 310 can be deposited over the substrate 300 by introducing a silylgermane source gas. Once the silicon germanium epitaxial layer 310 reaches a certain thickness above the critical thickness for the conditions and [Ge], the flow of the silylgermane source gas is stopped. Preferably, the silicon germanium epitaxial layer 310 is allowed to fully relax before serving as an effective intermediate buffer layer. For example, for some particular concentration of Ge in the film, a 10 nm silicon germanium film can be fully strained at 300° C., partially relaxed at 450° C., and fully relaxed at 500° C.

Figure 3D:
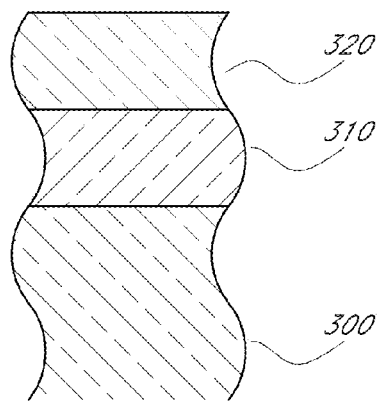

As shown in FIG. 3D, after the silicon germanium epitaxial layer 310 has been allowed to relax, a second heteroepitaxial layer 320 can be deposited thereover. Once the silicon germanium layer is in its relaxed state, it can serve as a buffer layer for upper strained layers, such as strained III-V material layers, or tensile strained silicon or compressively stressed pure germanium. In some embodiments, the silicon germanium layer can serve as a buffer layer for overlying relaxed layer(s). In one embodiment, a silicon germanium buffer layer is deposited that has a high germanium composition (e.g., 80 atomic % germanium), while a second epitaxial layer is deposited thereover that is of even higher germanium composition (e.g., 100 atomic % germanium).

By using the deposition methods described above, a germanium-containing film can be deposited with minimal coating of reactor surfaces. Conventional deposition processes often require frequent cleaning of the reaction chamber. By using silylgermane as a source gas, ratios of deposition on chamber walls vs. deposition on substrates are reduced, thus requiring reduced frequency and/or duration of cleaning. For example, in one embodiment in which silylgermane gas is used as a source gas at a temperature of 500° C. for 60 minutes, there is very minimal deposition on surfaces of the reaction chamber.

EXAMPLES

Using the methods described herein under various process parameters, it is possible to deposit a high quality silicon germanium layer having high germanium concentration that serves as an active layer or an intermediate buffer layer by using silylgermane source gas in combination with hydrogen or other reducing gas.

Example 1

In one embodiment, a substrate was provided in a reaction chamber. The substrate was heated to a temperature of about 450° C., while the pressure in the reaction chamber was kept at about 100 Torr. Silylgermane gas, stored with hydrogen gas as a diluent, was flowed into the reaction chamber along with 20 L of hydrogen carrier gas. The silylgemermane was introduced into the reaction chamber at three different flow rates: 100 sccm, 150 sccm and 180 sccm, resulting in the deposition of silicon germanium layers having 64 atomic %, 67 atomic % and 70 atomic % germanium percentage, respectively.

Example 2

Figure 4:
FIG. 4 is an x-ray reflectance graph characterizing a layer deposited under certain processing conditions according to one embodiment of the present application.

FIG. 4 is an x-ray reflectance graph showing the results of a deposition under processing conditions according to one embodiment of the present application. In a reaction chamber, a substrate was provided. The substrate was heated to a temperature of about 300° C., while the pressure in the reaction chamber was maintained at approximately 100 Torr. A source gas comprising 0.5% silylgermane in $H_2$ was introduced at a constant flow rate of approximately 175 sccm for 60 minutes to deposit a silicon germanium layer.

To determine the percentage of germanium in the deposited silicon germanium layer, an x-ray reflectance (XRR) test was performed. XRR allows the density of the SiGe film to be determined, which can then be used to determine approximate germanium percentage in a deposited film. Using XRR, it was determined that the deposited silicon germanium layer has a density of 4.4 g/cm$^3$. Once the density is determined, the density table (shown below as Table A) can be used to determine the corresponding germanium percentage in the deposited layer. The deposited silicon germanium layer, having a density of 4.4 g/cc, was therefore found to have a corresponding germanium percentage of about 70 atomic %. Thus, the deposited silicon germanium layer had a high germanium percentage and exhibited increased strain over conventionally deposited silicon germanium layers.

TABLE A

| Approx.[Ge] (%) | SiGe Density (g/cm$^3$) |
| --- | --- |
| 0 | 2.328 |
| 10 | 2.6302 |
| 20 | 2.9324 |
| 30 | 3.2346 |
| 40 | 3.5368 |
| 50 | 3.839 |
| 60 | 4.1412 |
| 70 | 4.4434 |
| 80 | 4.7456 |
| 90 | 5.0478 |
| 100 | 5.35 |

Example 3

Figure 5:
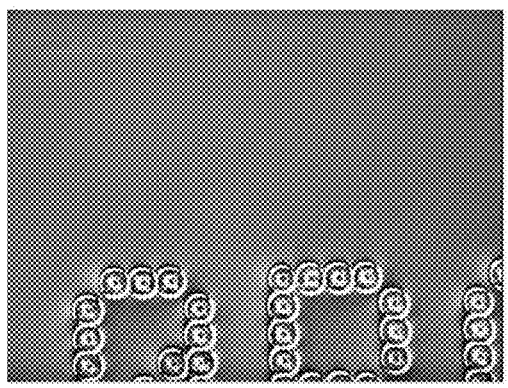
FIG. 5 illustrates micrographs of a silicon germanium surface area formed under certain processing conditions according to one embodiment of the present application.
Figure 5:
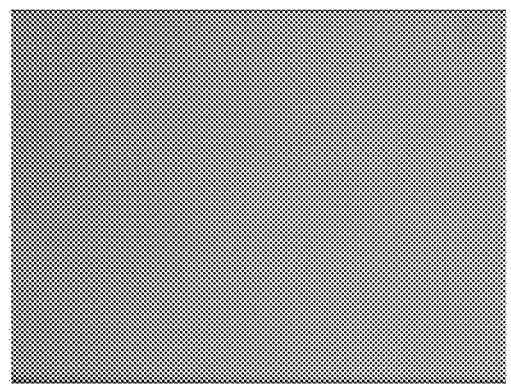

A chemical vapor deposition took place in a reaction chamber at a temperature of about 450° C. and a pressure of 100 Torr. Silylgermane was introduced at 100 sccm for approximately 30 minutes, resulting in the deposition of a silicon germanium layer. Micrographs were taken of the surface of the silicon germanium layer at 5× and 100× magnification and are shown in FIG. 5. As shown in FIG. 5, even at 100× magnification, the surface of the silicon germanium layer was nearly featureless, which supports that the use of silylgermane as a source gas resulted in the deposition of a smooth epitaxial layer of high quality.

Besides experiments performed at the reaction pressure of 100 Torr, other experiments were also performed at atmospheric pressure. While the experiments at atmospheric pressure resulted in a faster deposition rate of a germanium-containing film, the resulting films (all of which had greater than 50 atomic % germanium) had greater texture (roughness) than those silicon-germanium films deposited at 100 Torr.

It will be apparent to those skilled in the art that various modifications and variations can be made in the present invention without departing from the scope or spirit of the invention. For example, while FIG. 1B illustrates silylgermane stored with inert gas and a separate reducing gas source, the skilled artisan will appreciate that a separate inert gas can instead be used in container 258; container 262 can include reducing gas in place of or in addition to inert gas; and various other combinations will be appreciated in view of the teachings herein. Thus, it is intended that the present invention cover the modifications and variations of this invention provided that they come within the scope of the appended claims or their equivalents.

What is claimed is:

1. A method for depositing an epitaxial layer comprising:
providing a semiconductor substrate into a reaction chamber;
placing the substrate on a susceptor in the reaction chamber;
introducing silylgermane (SiGeH$_6$) gas to deposit an epitaxial silicon germanium layer in the absence of germanium sources other than silylgermane; and
introducing a diluent to the reaction chamber to modulate the level of germanium incorporation in the deposited epitaxial silicon germanium layer to have between 60 atomic % and 85 atomic % germanium.

2. The method of claim 1, wherein introducing comprises maintaining the substrate at a temperature between 350° C. and 475° C.

3. The method of claim 1, wherein introducing comprises forming the silicon germanium layer to a thickness less than 10 nm.

4. The method of claim 1, wherein introducing comprises forming the silicon germanium layer as a strained layer.

5. The method of claim 1, wherein introducing comprises forming the silicon germanium layer to have a film surface roughness of 5 nm rms or less.

6. The method of claim 1, wherein introducing comprises forming the silicon germanium layer as a relaxed buffer layer, further comprising depositing a strained heteroepitaxial active layer over the silicon germanium layer.

7. The method of claim 1, wherein introducing comprises forming the silicon germanium layer to have a thickness greater than its critical thickness.

8. The method of claim 1, wherein introducing comprises maintaining the reaction chamber at a pressure between 50-100 Torr.

9. The method of claim 1, wherein introducing comprises flowing hydrogen gas as the diluent.

10. The method of claim 9, wherein introducing comprises flowing the silylgermane gas and the hydrogen gas from the same container.

11. The method of claim 9, wherein introducing comprises flowing the silylgermane gas and the hydrogen gas from separate containers.

12. The method of claim 1, wherein introducing comprises flowing an inert gas as the diluent.

13. The method of claim 12, wherein introducing comprises flowing nitrogen gas as the diluent.

14. The method of claim 12, wherein introducing comprises selecting a partial pressure for silylgermane in the reaction chamber to correlate with a desired germanium concentration in the deposited epitaxial silicon germanium layer.

15. A method for depositing an epitaxial layer comprising:
providing a substrate into a reaction chamber;
placing the substrate on a susceptor in the reaction chamber;
providing a source of silylgermane gas in communication with the reaction chamber; and
providing a source of reducing gas in communication with the reaction chamber;
selecting a ratio of the silylgermane gas to the reducing gas to modulate a percentage of germanium desired for the epitaxial layer; and
introducing a mixture of the silylgermane gas and the reducing gas having the selected ratio to the reaction chamber in the absence of germanium sources other than silylgerman to form an epitaxial silicon germanium layer having the desired percentage of germanium, wherein the epitaxial silicon germanium layer has between 60 atomic % germanium and 85 atomic % germanium.

16. The method of claim 15, wherein the reducing gas comprises hydrogen gas.

17. The method of claim 16, wherein introducing the mixture comprises flowing the reducing gas stored with the silylgermane gas in the selected ratio.

18. The method of claim 16, wherein introducing the mixture comprises flowing the reducing gas stored separately from the silylgermane gas.

19. The method of claim 16, wherein introducing the mixture comprises providing the ratio of silylgermane gas to hydrogen gas of between about 1:1000 and 1:20.

* * * * *

UNITED STATES PATENT AND TRADEMARK OFFICE
CERTIFICATE OF CORRECTION

PATENT NO. : 9,127,345 B2
APPLICATION NO. : 13/413495
DATED : September 8, 2015
INVENTOR(S) : Nyles W. Cody It is certified that error appears in the above-identified patent and that said Letters Patent is hereby corrected as shown below:

In column 1 (page 3, item 56) at line 19, Under Other Publications, change "lintegrated" to --integrated--.

In column 2 (page 3, item 56) at line 47, Under Other Publications, change "Surficant-Assisted" to --Surfactant-Assisted--.

In column 2 (page 3, item 56) at line 48, Under Other Publications, change "Superlattic" to --Superlattice--.

In column 7 at line 42, Change "100 Ton" to --100 Torr--.

In column 10 at line 4, Change "silylgemermane" to --silylgermane--.

In column 12 at line 34, In Claim 15, change "silylgerman" to --silylgermane--.

Signed and Sealed this
Second Day of August, 2016

Michelle K. Lee
*Director of the United States Patent and Trademark Office*